(12) United States Patent
Hsu (10) Patent No.: US 7,060,567 B1
(45) Date of Patent: Jun. 13, 2006

(54) METHOD FOR FABRICATING TRENCH POWER MOSFET

(75) Inventor: Hsiu-Wen Hsu, Hsinchu (TW)

(73) Assignee: Episil Technologies Inc., Hsinchu (TW)

( * ) Notice: Subject to any disclaimer, the term of this patent is extended or adjusted under 35 U.S.C. 154(b) by 0 days.

(21) Appl. No.: 11/161,173

(22) Filed: Jul. 26, 2005

(51) Int. Cl.
*H01L 21/336* (2006.01)

(52) U.S. Cl. .................. 438/270; 438/589; 438/702; 438/947

(58) Field of Classification Search .............. 438/268, 438/270, 589, 947
See application file for complete search history.

(56) References Cited

U.S. PATENT DOCUMENTS

| | | | |
|---|---|---|---|
| 5,045,903 A * | 9/1991 | Meyer et al. ............. 257/339 |
| 5,093,273 A * | 3/1992 | Okumura .................. 438/282 |
| 5,897,343 A * | 4/1999 | Mathew et al. ........... 438/133 |
| 6,211,018 B1 * | 4/2001 | Nam et al. ............... 438/270 |
| 6,518,129 B1 * | 2/2003 | Hueting et al. ........... 438/270 |
| 2002/0123195 A1 * | 9/2002 | Frisina et al. ............ 438/268 |
| 2003/0096479 A1 * | 5/2003 | Hshieh et al. ............ 438/270 |
| 2006/0019447 A1 * | 1/2006 | Gutsche et al. .......... 438/270 |

* cited by examiner

*Primary Examiner*—Matthew S. Smith
*Assistant Examiner*—John M. Parker
(74) *Attorney, Agent, or Firm*—Jianq Chyun IP Office (57) ABSTRACT

A method for fabricating trench power MOSFET is described. An epitaxial layer and a mask layer having a first opening are sequentially formed on a substrate. A pair of spacers is formed on the sidewalls of the first opening. A second opening exposing the surface of the epitaxial layer is formed by removing a portion of the mask layer. The spacers are removed and then a trench is formed in the epitaxial layer using the mask layer as a mask. The mask layer is removed and a gate oxide layer is formed over the epitaxial layer and the surface of the trench. A gate layer is formed to fill the trench. A body well region is formed in the epitaxial layer adjacent to the sidewalls of the trench. A source region is formed in the body well region on each side at the top of the trench.

20 Claims, 7 Drawing Sheets

METHOD FOR FABRICATING TRENCH POWER MOSFET

BACKGROUND OF THE INVENTION

1. Field of the Invention

The present invention relates to a method for fabricating a power metal-oxide-semiconductor field effect transistor (MOSFET), and more particularly, to a method for fabricating a trench power MOSFET.

2. Description of the Related Art

Power metal-oxide-semiconductor field effect transistor (MOSFET) is a type of high voltage device that can operate at a voltage of about 4500V and upwards. The conventional method of fabricating the power device is very similar to the fabrication of common semiconductor devices. The gate of the power device is formed on the surface of a silicon substrate in the so-called planar gate fabrication method. However, this type of planar gate structures has the disadvantage of being limited by the design of a required smallest gate length. In other words, it is difficult to increase the packing density of devices.

As a result, a trench type fabrication method has been developed to significantly decrease the dimension of the power devices. Accordingly, the trench gate fabrication has become the trend for manufacturing power devices.

SUMMARY OF THE INVENTION

Accordingly, at least one objective of the present invention is to provide a method for fabricating trench power metal-oxide-semiconductor field effect transistor (MOSFET) having a smaller trench dimension so that the pattern density as well as the degree of integration of power devices can be increased.

The present invention provides a method for fabricating a trench power MOSFET. First, an epitaxial layer and a mask layer having a first opening are sequentially formed on a substrate. A pair of spacers is formed on the sidewalls of the first opening. A portion of the mask layer is removed using the spacers as a mask to form a second opening that exposes the surface of the epitaxial layer. The spacers are removed and a trench is formed in the epitaxial layer again using the mask layer as a mask. Then, the mask layer is removed and a gate oxide layer is formed over the epitaxial layer and the surface of the trench. After that, a gate layer is formed to fill the trench and a body well region is formed in the epitaxial layer adjacent to the sidewalls of the trench. Lastly, a source region is formed in the body well region on each side at the top of the trench.

According to an embodiment of the present invention, the method of forming the spacers includes forming a spacer material layer over the mask layer and performing an anisotropic etching process to remove a portion of the spacer material layer. In addition, the material of the spacer can be, for example, silicon nitride.

According to an embodiment of the present invention, the method of forming the mask layer includes performing a chemical vapor deposition process, for example. In addition, the material of the mask layer can be, for example, silicon oxide.

According to an embodiment of the present invention, the method of forming the gate oxide layer includes performing a thermal oxidation process, for example.

According to an embodiment of the present invention, the method of forming the gate layer includes performing a chemical vapor deposition process, for example.

According to an embodiment of the present invention, the method of forming the body well region includes performing an ion implant process, for example.

According to an embodiment of the present invention, the method of forming the source region includes performing an ion implant process, for example.

The present invention also provides an alternative method for fabricating a trench power MOSFET. First, an epitaxial layer, a first mask layer, a second mask layer and a third mask layer are sequentially formed over a substrate. Then, a first opening that exposes a portion of the surface of the second mask layer is formed in the third mask layer. After that, a pair of spacers is formed on the sidewalls of the first opening. Using the spacers as a mask, the third mask layer, a portion of the second mask layer and a portion of the first mask layer are removed to form a second opening that exposes the surface of the epitaxial layer. Next, the spacers and the second mask layer are removed. Then, a trench is formed in the epitaxial layer using the first mask layer as a mask. The first mask layer is removed and then a gate oxide layer is formed over the epitaxial layer and the trench surface. A gate layer is formed to fill the trench and a body well region is formed in the epitaxial layer adjacent to the sidewalls of the trench. Lastly, a source region is formed in the body well region on each side at the top of the trench.

According to an embodiment of the present invention, the method of forming the spacers includes forming a spacer material layer over the third mask layer with the first opening and performing an anisotropic etching process to remove a portion of the spacer material layer. In addition, the material of the spacers can be, for example, silicon nitride.

According to an embodiment of the present invention, the method of forming the first mask layer, the second mask layer and the third mask layer includes performing a chemical vapor deposition process. The material of the first mask layer can be silicon oxide, the material of the second mask layer can be polysilicon and the material of the third mask layer can be silicon oxide, for example.

According to an embodiment of the present invention, the method of forming the gate layer includes performing a chemical vapor deposition process, for example.

According to an embodiment of the present invention, the method of forming the body well region includes performing an ion implant process, for example.

According to an embodiment of the present invention, the method of forming the source region includes performing an ion implant process, for example.

In the present invention, the spacers are used as a mask to form a mask layer having an opening with a smaller dimension. Then, using the mask layer as a mask, a trench having a smaller dimension can be formed. In this way, the ultimate limitation imposed by the conventional photolithographic process is relaxed so that a higher pattern density and degree of integration for the devices can be attained.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

In the embodiment of the present invention, the method of fabricating an n-type power MOSFET is illustrated. The power MOSFET has an n-doped silicon substrate, an n-type epitaxial silicon layer and a p-type body well region. However, the invention is not limited as such because some of the processing steps in the present invention can be rearranged or modified to suit a particular application.

FIGS. 1A through 1H are schematic cross-sectional views showing the steps for fabricating a trench power MOSFET according to one embodiment of the present invention.

Figure 1A:
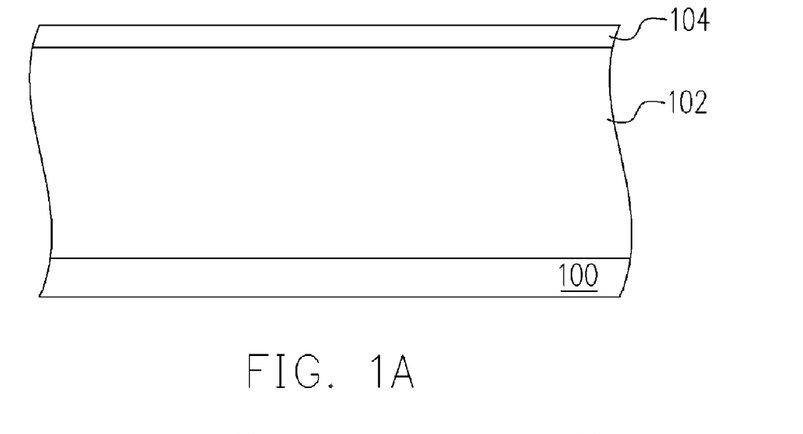
FIGS. 1A through 1H are schematic cross-sectional views showing the steps for fabricating a trench power MOSFET according to one embodiment of the present invention.

First, as shown in FIG. 1A, a substrate 100 having an epitaxial layer 102 thereon is provided. The material of the epitaxial layer 102 can be an n-doped silicon with a dopant concentration lower than that of the substrate 100, for example. Then, a mask layer 104 is formed over the substrate 100. The material of the mask layer 104 can be silicon oxide or other suitable material, for example. The mask layer 104 is formed, for example, by performing a chemical vapor deposition process or other appropriate process.

Figure 1B:
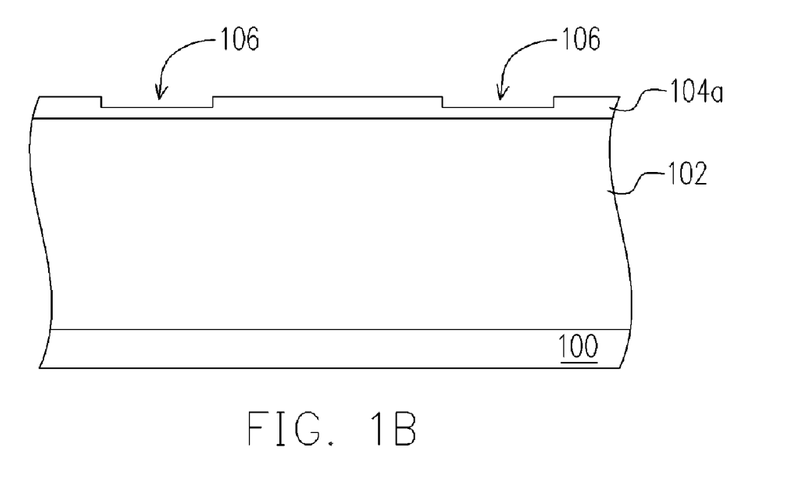

As shown in FIG. 1B, an opening 106 is formed in the mask layer 104. The method of forming the opening 106 includes fabricating a patterned photoresist layer (not shown) over the mask layer 104 and removing a portion of the mask layer 104 using the patterned photoresist layer as an etching mask.

Figure 1C:
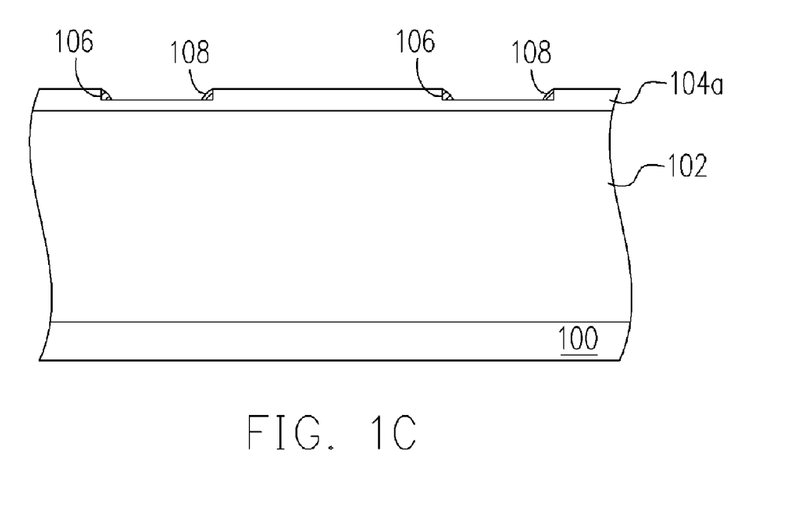

As shown in FIG. 1C, a pair of spacers 108 is formed on the sidewalls of the opening 106. The material of the spacers 108 can be silicon nitride, for example. The method of forming the spacers 108 includes forming a spacer material layer (not shown) over the mask layer 104b and performing an anisotropic etching process to remove a portion of the spacer material layer.

Figure 1D:
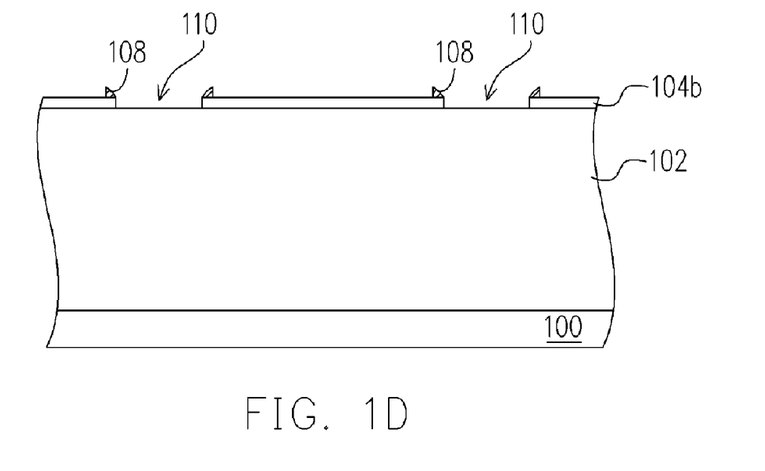

As shown in FIG. 1D, a portion of the mask layer 104a is removed using the spacers 108 as a mask to form an opening 110 that exposes the surface of the epitaxial layer 102. The method of removing a portion of the mask layer 104a includes performing an etching process.

Figure 1E:
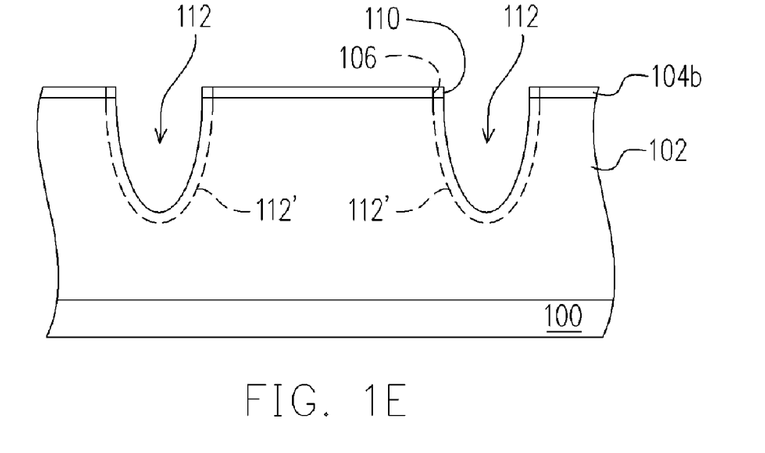

As shown in FIG. 1E, the spacers 108 are removed. After that, a trench 112 is formed in the epitaxial layer 102 using the mask layer 104b as an etching mask. The method of forming the trench 112 includes performing an etching process, for example.

Particularly note that the trench is formed by etching away a portion of the epitaxial layer using the mask layer with openings defined thereon as an etching mask in a conventional method. The trench so formed is depicted as 112' in FIG. 1E. However, the mask layer 104b to be used for defining trench patterns has openings with smaller dimensions because the openings are formed using the spacers 108. Therefore, the subsequently formed trenches 112 have smaller dimensions. In other words, using the spacers as mask in the present invention, a mask layer with smaller opening patterns is produced. In this way, the ultimate dimensional limitation in a photolithographic process can be relaxed so that the trench dimensions are reduced while the pattern density is increased.

Figure 1F:
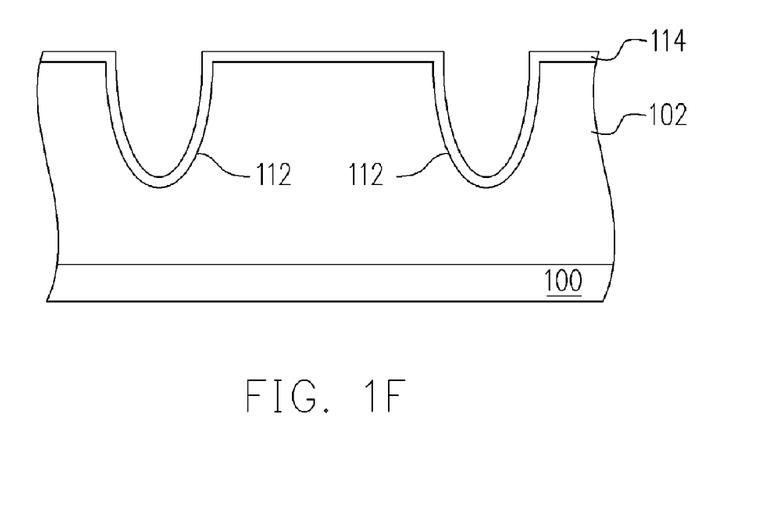

As shown in FIG. 1F, the mask layer 104b is removed after forming the trench 112. Then, a gate oxide layer 114 is formed over the epitaxial layer 102 and the surface of the trench 112. The material of the gate oxide layer 114 can be, for example, silicon oxide or other suitable material. The method of forming the gate oxide layer 114 includes performing a thermal oxidation process or other suitable process, for example.

Figure 1G:
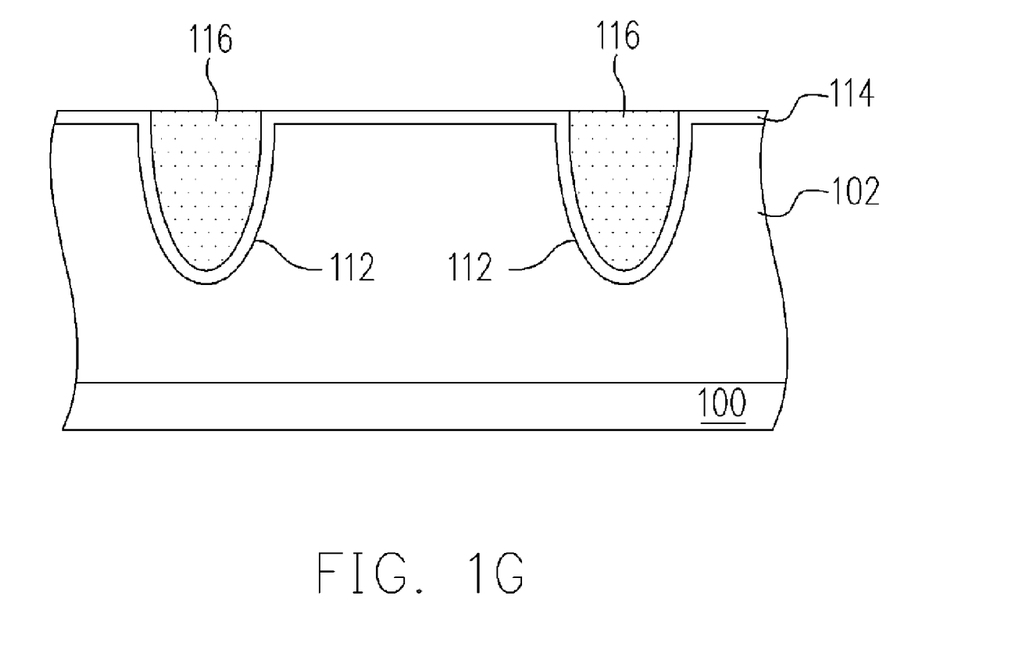

As shown in FIG. 1G, a gate layer 116 is formed to fill the trench 112. The material of the gate layer 116 can be, for example, polysilicon or other suitable material. The method of forming the gate layer 116 includes performing a chemical vapor deposition process to form a gate material layer over the gate oxide layer 114 and the trench 112. Then, the gate material layer is etched back or a chemical-mechanical polishing operation is performed to remove a portion of the gate material layer until the gate oxide layer 114 is exposed.

Figure 1H:
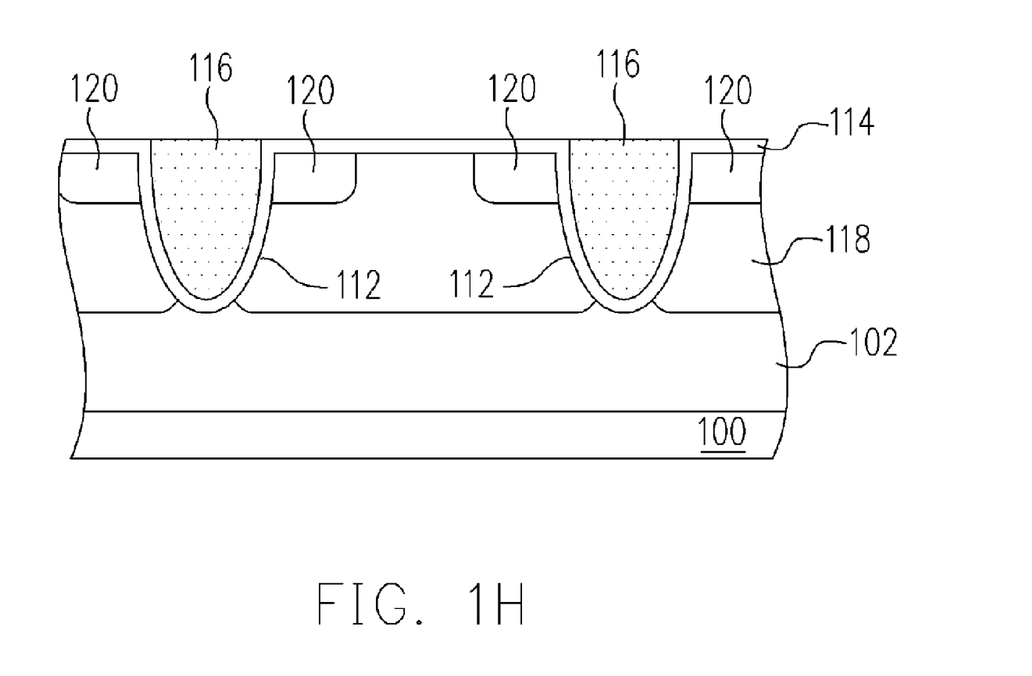

As shown in FIG. 1H, a body well region 118 is formed in the epitaxial layer 102 adjacent to each side of the trench 112. The body well region 118 is formed, for example, by performing an ion implant process. With the epitaxial layer 102 containing n-type dopants, for example, p-type boron ions are preferably used in the ion implant process. Next, a source region 120 is formed in the body well region 118 on each side at the top of the trench 112. The source regions 120 are formed, for example, by performing an ion implant process.

Following is an illustration of another embodiment for fabricating a trench power MOSFET according to the present invention.

FIGS. 2A through 2H are schematic cross-sectional views showing the steps for fabricating a trench power MOSFET according to another embodiment of the present invention.

Figure 2A:
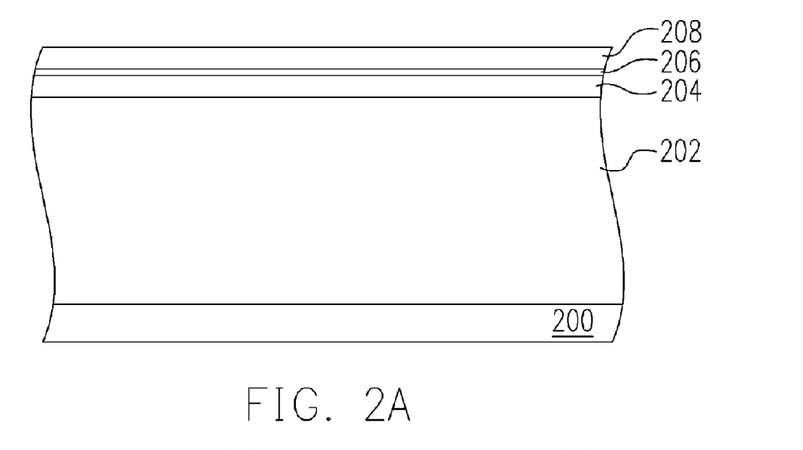
FIGS. 2A through 2H are schematic cross-sectional views showing the steps for fabricating a trench power MOSFET according to another embodiment of the present invention.

First, as shown in FIG. 2A, a substrate 200 having an epitaxial layer 202 thereon is provided. The material of the epitaxial layer 202 can be n-doped silicon having a dopant concentration lower than that of the substrate 200, for example. Then, mask layers 204, 206, 208 are sequentially formed over the substrate 200. The mask layers 204, 206, 208 are formed, for example, by performing a chemical vapor deposition process. The material of the mask layer 204 can be silicon oxide; the material of the mask layer 206 can be polysilicon; and the material of the mask layer 208 can be silicon oxide, for example.

Figure 2B:
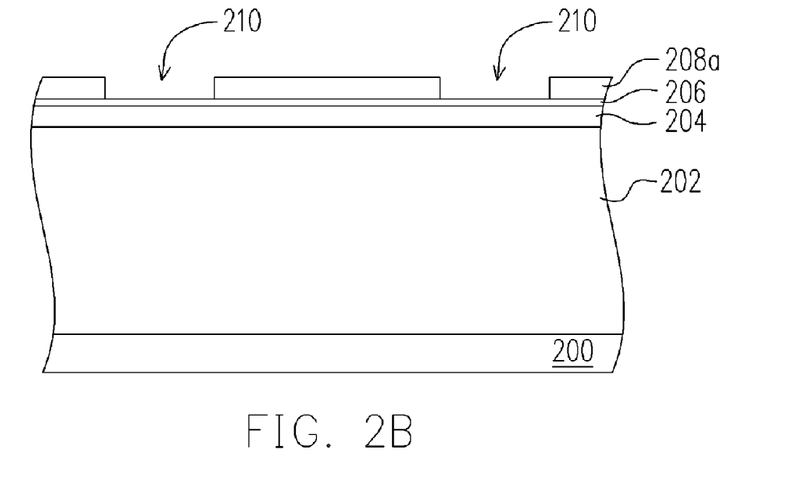

As shown in FIG. 2B, an opening 210 that exposes the surface of the mask layer 206 is formed in the third mask layer 208. The method of forming the opening 210 includes forming a patterned photoresist layer (not shown) over the mask layer 208 and removing a portion of the mask layer 208 using the patterned photoresist layer as a mask and the mask layer 208 as an etching stop layer.

Figure 2C:
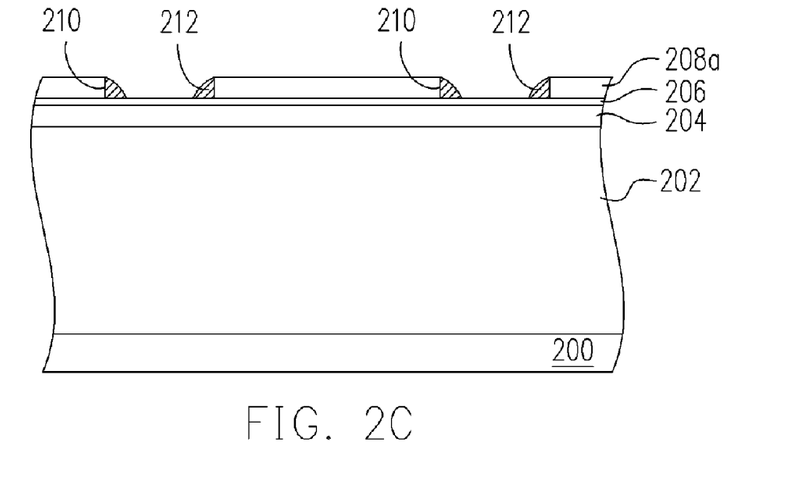

As shown in FIG. 2C, a pair of spacers 212 is formed on the sidewalls of the opening 210. The material of the spacers 212 can be silicon nitride, for example. The method of forming the spacers 212 includes forming a spacer material layer over the mask layer 208a and performing an anisotropic etching operation to remove a portion of the spacer material layer, for example.

Figure 2D:
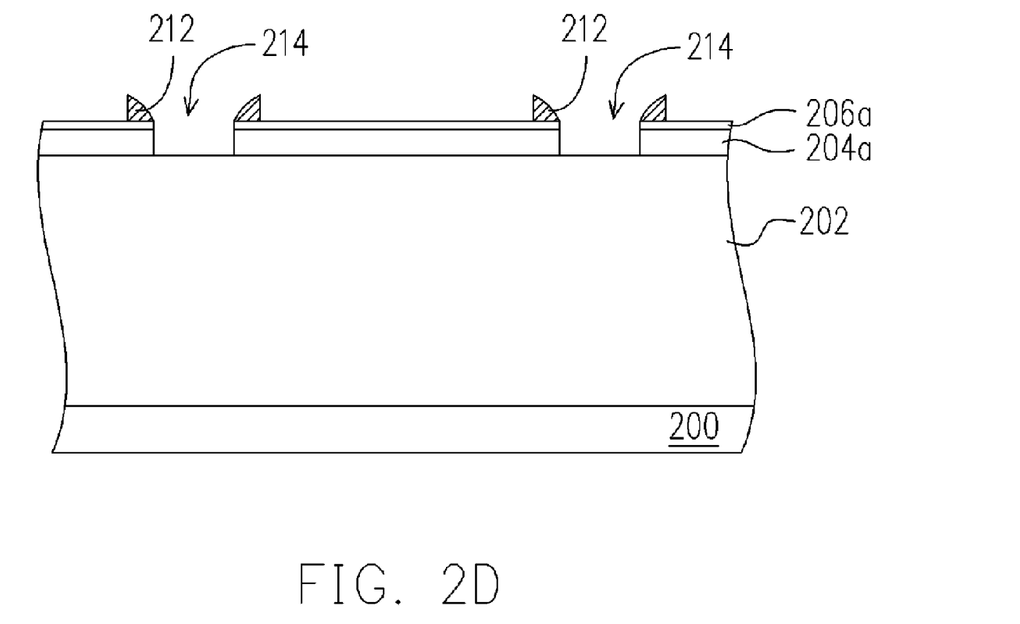

As shown in FIG. 2D, using the spacers 212 as a mask, the mask layer 208a, a portion of the mask layer 206 and a portion of the mask layer 204 are removed to form an opening 214 that exposes the surface of the epitaxial layer 202. The method of removing the mask layer 208a, a portion of the mask layer 206 and a portion of the mask layer 204 includes performing an etching process, for example.

Figure 2E:
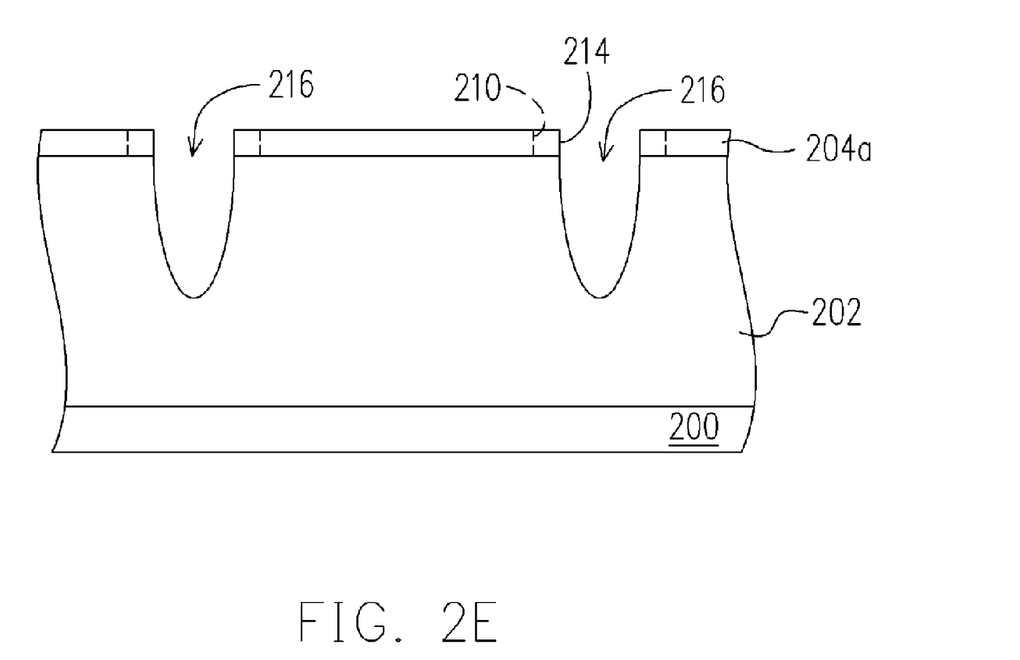

As shown in FIG. 2E, the spacers 212 and the mask layer 206a are removed. Then, using the mask layer 204a as a mask, a trench 216 is formed in the epitaxial layer 202. The method of forming the trench 216 includes performing an etching process, for example.

In the aforementioned process, the spacers 212 are used as a mask to form a mask layer 204a with openings 214 having smaller dimensions so that the subsequently formed trench 216 can have a smaller dimension.

Figure 2F:
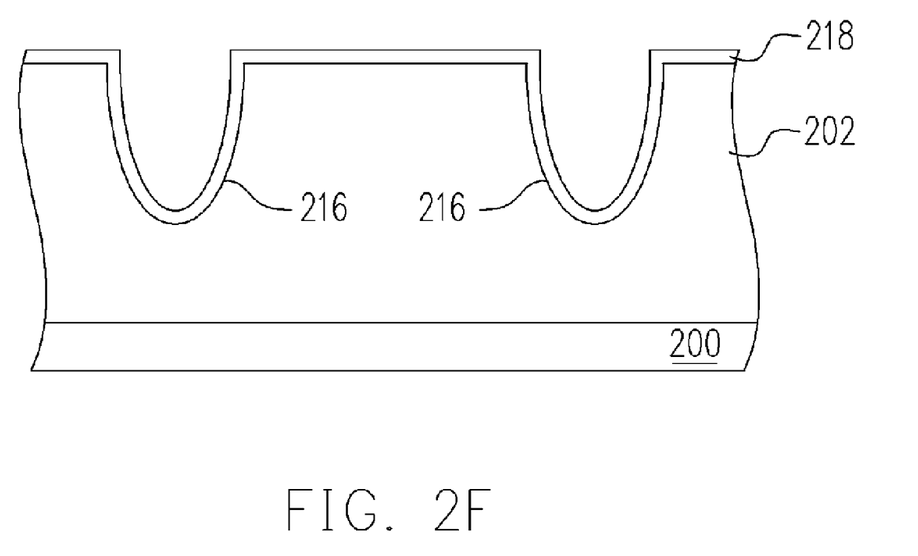

As shown in FIG. 2F, the mask layer 204a is removed after the formation of trenches 216. Then, a gate oxide layer 218 is formed over the epitaxial layer 202 and the surface of the trench 216. The material of the gate oxide layer 218 can be silicon oxide or other suitable material, for example. The gate oxide layer 114 is formed, for example, by performing a thermal oxidation process or other suitable process.

Figure 2G:
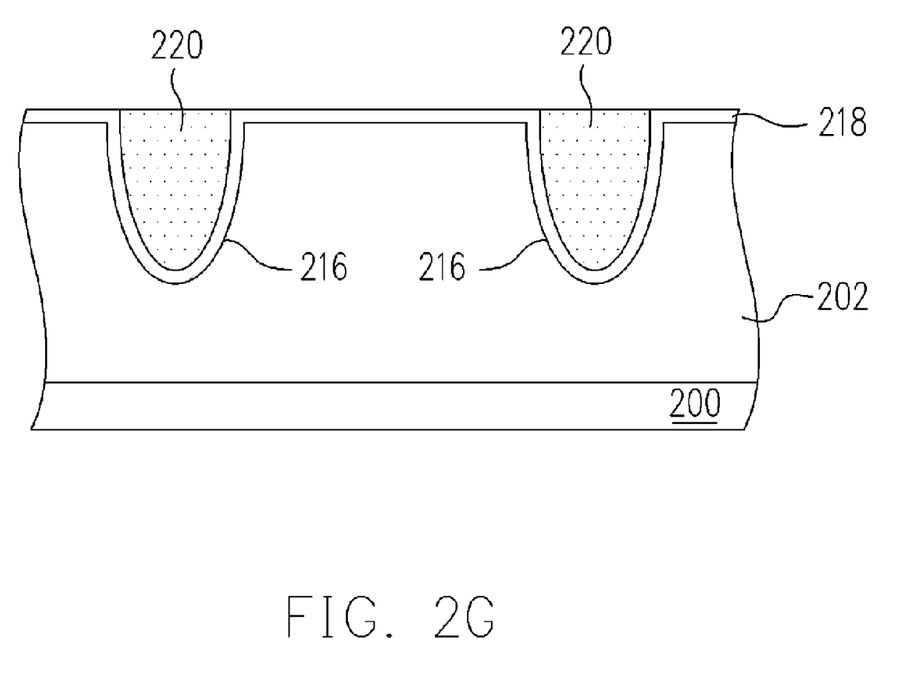

As shown in FIG. 2G, a gate layer 220 is formed to fill the trench 216 completely. The material of the gate layer 220 can be polysilicon or other suitable material, for example. The method of forming the gate layer 220 includes performing a chemical vapor deposition process to form a gate material layer over the gate oxide layer 218 and the trench 216. Then, the gate material layer is etched back or chemical-mechanically polished to remove a portion of the gate material layer until the gate oxide layer 218 is exposed.

Figure 2H:
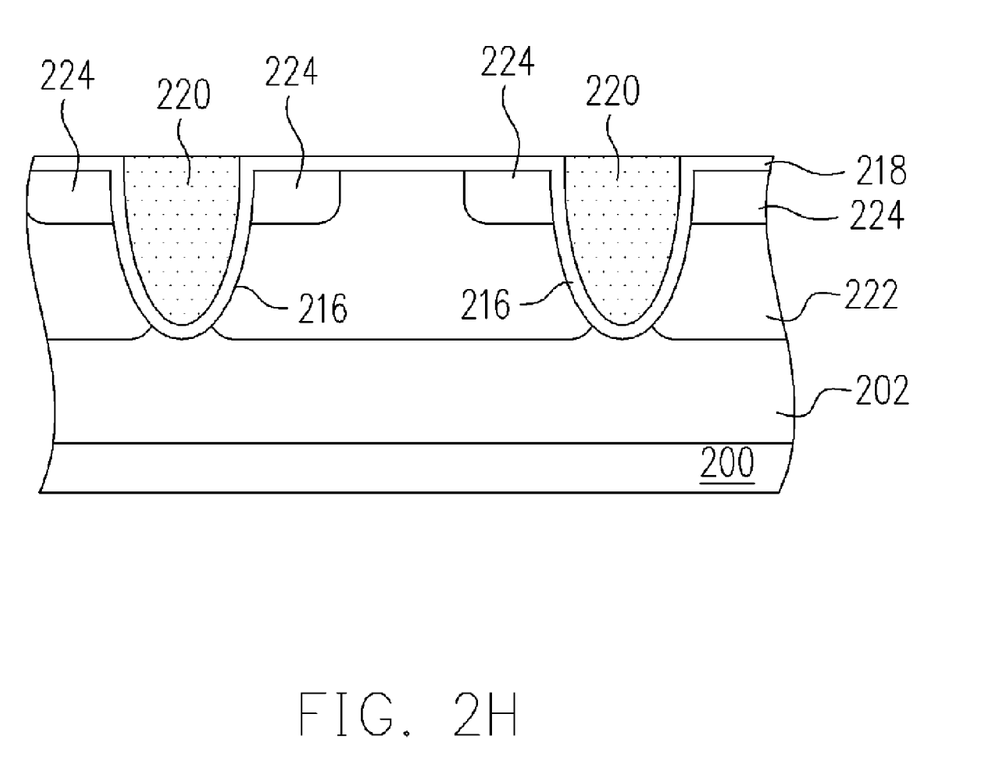

As shown in FIG. 2H, a body well region 222 is formed in the epitaxial layer 202 adjacent to each side of the trench 216. The body well region 222 is formed, for example, by performing an ion implant process. With the epitaxial layer 202 containing n-type dopants, for example, p-type boron ions are preferably used in the ion implant process. Then, a source region 224 is formed in the body well region 222 on each side at the top of the trench 216. The source regions 224 are formed, for example, by performing an ion implant process.

In summary, the dimension of the trench in the process of fabricating the trench power MOSFET is determined through the defined opening pattern in the mask layer. Therefore, in the present invention, the spacers are used as a mask to form a mask layer having an opening with a smaller dimension so that a trench having a smaller dimension can be formed. In this way, dimensional limitation imposed by the conventional photolithographic process is relaxed so that a higher pattern density and degree of integration for the devices can be attained.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a trench power metal-oxide-semiconductor field effect transistor (MOSFET), comprising:
    forming an epitaxial layer and a mask layer having a first opening sequentially over a substrate;
    forming a pair of spacers on the sidewalls of the first opening;
    removing a portion of the mask layer using the pair of spacers as a mask to form a second opening that exposes the surface of the epitaxial layer;
    removing the pair of spacers;
    forming a trench in the epitaxial layer using the mask layer as a mask;
    removing the mask layer;
    forming a gate oxide layer over the epitaxial layer and the surface of the trench;
    forming a gate layer to fill the trench;
    forming a body well region in the epitaxial layer adjacent to the sidewalls of the trench; and
    forming a source region in the body well region on each side at the top of the trench.

2. The method of fabricating a trench power MOSFET of claim 1, wherein a method of forming the pair of spacers comprises:
    forming a spacer material layer over the mask layer; and
    performing an anisotropic etching process to remove a portion of the spacer material layer.

3. The method of fabricating a trench power MOSFET of claim 1, wherein a material of the pair of spacers comprises silicon nitride.

4. The method of fabricating a trench power MOSFET of claim 1, wherein a method of forming the mask layer includes performing a chemical vapor deposition process.

5. The method of fabricating a trench power MOSFET of claim 1, wherein a material of the mask layer comprises silicon oxide.

6. The method of fabricating a trench power MOSFET of claim 1, wherein a method for forming the gate oxide layer includes performing a thermal oxidation process.

7. The method of fabricating a trench power MOSFET of claim 1, wherein a method of forming the gate layer includes performing a chemical vapor deposition process.

8. The method of fabricating a trench power MOSFET of claim 1, wherein a method of forming the body well region includes performing an ion implant process.

9. The method of fabricating a trench power MOSFET of claim 1, wherein a method of forming the source region includes performing an ion implant process.

10. A method of fabricating a trench power metal-oxide-semiconductor field effect transistor (MOSFET), comprising:
    forming an epitaxial layer, a first mask layer, a second mask layer and a third mask layer sequentially over a substrate;
    forming a first opening in the third mask layer to expose the surface of the second mask layer;
    forming a pair of spacers on the sidewalls of the first opening;
    removing the third mask layer, a portion of the second mask layer and a portion of the first mask layer using the pair of spacers as a mask to form a second opening that exposes the surface of the epitaxial layer;
    removing the pair of spacers and the second mask layer;
    forming a trench in the epitaxial layer using the first mask layer as a mask;
    removing the first mask layer;
    forming a gate oxide layer over the epitaxial layer and the surface of the trench;
    forming a gate layer to fill the trench;
    forming a body well region in the epitaxial layer adjacent to the sidewalls of the trench; and
    forming a source region in the body well region on each side at the top of the trench.

11. The method of fabricating a trench power MOSFET of claim 10, wherein a method of forming the pair of spacers comprises:
    forming a spacer material layer over the third mask layer with a first opening; and
    performing an anisotropic etching process to remove a portion of the spacer material layer.

12. The method of fabricating a trench power MOSFET of claim 10, wherein a material of the pair of spacers comprises silicon nitride.

13. The method of fabricating a trench power MOSFET of claim 10, wherein a method of forming the first mask layer, the second mask layer and the third mask layer includes performing a chemical vapor deposition process.

14. The method of fabricating a trench power MOSFET of claim 10, wherein a material of the first mask layer comprises silicon oxide.

15. The method of fabricating a trench power MOSFET of claim 10, wherein a material of the second mask layer comprises polysilicon.

16. The method of fabricating a trench power MOSFET of claim 10, wherein a material of the third mask layer comprises silicon oxide.

17. The method of fabricating a trench power MOSFET of claim 10, wherein a method of forming the gate oxide layer includes performing a thermal oxidation process.

18. The method of fabricating a trench power MOSFET of claim 10, wherein a method of forming the gate layer includes performing a chemical vapor deposition process.

19. The method of fabricating a trench power MOSFET of claim 10, wherein a method of forming the body well region includes performing an ion implant process.

20. The method of fabricating a trench power MOSFET of claim 10, wherein a method of forming the source region includes performing an ion implant process.

* * * * *